(12) United States Patent
Oddoart et al.

(10) Patent No.: US 8,625,820 B2
(45) Date of Patent: Jan. 7, 2014

(54) AMPLIFIER CIRCUIT AUDIO CIRCUIT AND ELECTRONIC DEVICE

(75) Inventors: Ludovic Oddoart, Frouzins (FR); Gerhard Trauth, Muret (FR); Jean-Luc Charlet, Saint Paul sur Save (FR)

(73) Assignee: Freescale Semiconductor, Inc., Austin, TX (US)

( * ) Notice: Subject to any disclaimer, the term of this patent is extended or adjusted under 35 U.S.C. 154(b) by 498 days.

(21) Appl. No.: 12/742,665

(22) PCT Filed: Nov. 16, 2007

(86) PCT No.: PCT/IB2007/055389
§ 371 (c)(1),
(2), (4) Date: May 13, 2010

(87) PCT Pub. No.: WO2009/063277
PCT Pub. Date: May 22, 2009

(65) Prior Publication Data
US 2010/0272293 A1    Oct. 28, 2010

(51) Int. Cl.
*H03F 99/00* (2009.01)
*H04R 5/00* (2006.01)

(52) U.S. Cl.
USPC .................................. 381/120; 381/28; 381/1

(58) Field of Classification Search
USPC ....................... 381/120, 309, 74, 17, 1, 28, 27
See application file for complete search history.

(56) References Cited

U.S. PATENT DOCUMENTS

| | | | |
|---|---|---|---|
| 6,552,607 | B1 | 4/2003 | Danielson |
| 7,889,875 | B2 * | 2/2011 | Hu et al. .................... 381/120 |
| 2004/0091121 | A1 * | 5/2004 | Morimoto ...................... 381/74 |
| 2004/0125968 | A1 * | 7/2004 | Pearce et al. ................. 381/120 |
| 2008/0118092 | A1 * | 5/2008 | Chen et al. ................... 381/309 |
| 2008/0285762 | A1 * | 11/2008 | Iwamoto et al. ............... 381/17 |

FOREIGN PATENT DOCUMENTS

GB    2132858 A    7/1984

OTHER PUBLICATIONS

International Search Report and Written Opinion correlating to PCT/IB2007/055389 dated Jun. 23, 2008.

* cited by examiner

*Primary Examiner* — Xu Mei

(57) ABSTRACT

An amplifier circuit which, includes a first input for receiving a first input signal and a second input for receiving a second input signal. A first amplifier section is connected to the first input and the second input is present. The first amplifier section can combine the first signal and the second signal into a first combined signal, the first amplifier being connected to a first output, for outputting the first combined signal. A second amplifier section is connected to the first input and the second input, for combining the first signal and the second signal into a second combined signal, the second amplifier being connected to a second output, for outputting the second combined signal. A common mode section is connected to the first input and the second input, for generating a common mode signal based on a combination of the first signal and the second signal and outputting the common mode signal at a common output connected to the common mode amplifier. The first combined signal, the second combined signal and the common mode signal satisfy the condition that combining the first combined signal and the common mode signal results in a signal with an amplitude proportional to the amplitude of the first input signal and combining the second combined signal and the common mode signal results in a signal with an amplitude proportional to the amplitude of the second input signal.

20 Claims, 3 Drawing Sheets

AMPLIFIER CIRCUIT AUDIO CIRCUIT AND ELECTRONIC DEVICE

FIELD OF THE INVENTION

This invention relates to an amplifier circuit, to an audio circuit, and to an electronic device.

BACKGROUND OF THE INVENTION

Amplifier circuits are generally known in the art and used, for example, to provide amplified signals to the loudspeakers of a headset. For example, amplifier circuits are known which can be connected to a headset via a three or four pole jacket and plug configuration. Between the signal outputs of the amplifier circuit and the headset, large value coupling capacitors are typically present. The large value coupling capacitors are expensive and occupy a relatively large area.

Amplifier circuits in which the need for the large value coupling capacitors is obviated are known. Referring to FIG. 1 of the accompanying drawings, an amplifier circuit 10 as is known from the prior art is shown. The amplifier circuit 10 is connected to a headset 20 which comprises two loudspeakers 210,220 each with respective negative and positive contacts 211,212;221,222. As shown the negative contacts 212,222 are both connected to the same common ground contact 202 and the positive contacts 211,221 are connected to separate signal contacts 200,201. The amplifier circuit 10 has stereo channel inputs 100,101 at which a left channel signal and a right channel signal can respectively be received. At shown, the left channel input 100 is connected to an input 121 of a left channel amplifier 120. The output 122 of the left channel amplifier 120 is connected to a left channel output contact 110 of the amplifier. The right channel input 101 is connected to an input 131 of a right channel amplifier 130. The output 132 of the right channel amplifier 130 is connected to a right channel output contact 111 of the amplifier circuit 10. As shown in FIGS. 2A and 2C, at the amplifier outputs 122,132, amplified channel signals are outputted which have an amplitude proportional to the amplitude of the left channel signal and the right channel signal respectively.

The left channel output contact 110 is connected to one signal contact 200 of the headset 20 and the right channel output contact 111 is connected to the other signal contact 201. The amplifier circuit 10 further includes an operational amplifier 140 which is connected to a ground contact 112. The ground contact 112 is connected to the common ground contact 202 of the headset 20. The operational amplifier 140 provides a "virtual" ground voltage equal to the common mode of the left channel signal and the right channel signal. As illustrated in FIG. 2B, at the ground contact a constant voltage is outputted which is equal to the amplifier gain voltage VAG (short for virtual analog ground) set at the positive input of the operational amplifier. Typically, the amplifier gain voltage VAG is set to half the supply voltage Vcc.

However, although the shown prior art circuit allows the use of a conventional headset with a three pole plug without requiring coupling capacitors between the amplifier circuit 10 and the headset 20, a disadvantage of the prior art circuit is that the circuit 10 requires an accurate determination of the common mode in order to set amplifier gain voltage VAG. Furthermore, the circuit 10 consumes a relatively large amount of power and has a relatively large footprint because of the operational amplifier 140.

SUMMARY OF THE INVENTION

The present invention provides an amplifier circuit, an audio circuit, and an electronic device and as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings.

DETAILED DESCRIPTION OF THE PREFERRED EMBODIMENTS

Figure 3:
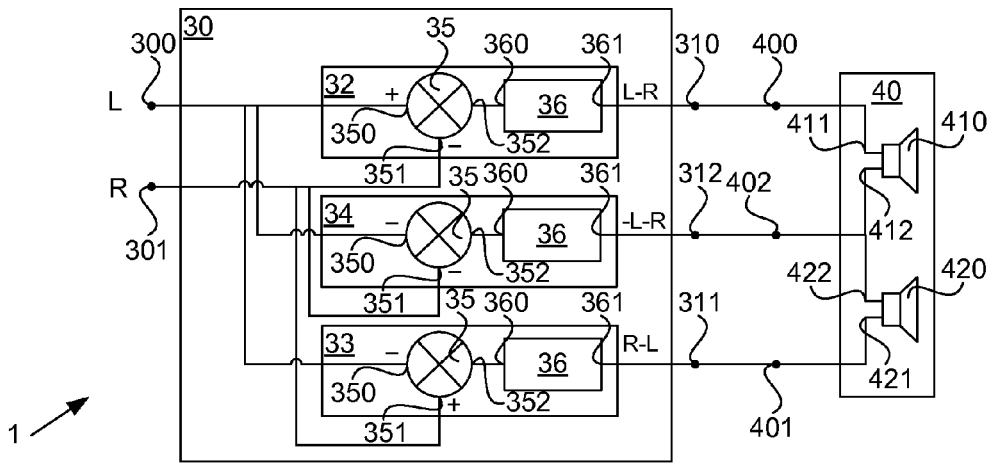
FIG. 3 shows a block diagram of an example of a configuration of a first example of an embodiment of an amplifier circuit and a headset.

Referring FIG. 3, an example of an embodiment of an amplifier circuit 30 is shown therein. The amplifier circuit 30 may, as shown, include a first input 300 for receiving first input signal and a second input 301 for receiving a second signal. As shown in FIG. 3, the amplifier circuit 30 may include a first amplifier section 32, a second amplifier section 33, as well as a common mode section 34.

In the following, the amplifier circuit 30 will be elucidated further using the example of a stereo audio signal which comprises a left channel signal which is to be outputted at a loudspeaker at a first side and a right channel signal which is to be outputted at a loudspeaker at a second side. The first input signal will be referred to as the left channel signal, the second input signal as the right channel signal, the first input will be referred to as the left channel input 300 and the second input will be referred to as the right channel input 301. The first amplifier section 32 will be referred to as the left channel amplifier section 32 and the second amplifier section will be referred to as the right channel amplifier section 33. However, it will be apparent that the amplifier circuit 30 may be used to amplify other types of signals.

The left channel amplifier section 32 may be connected to the left channel input 300 and the right channel input 301. The left channel amplifier section 32 may generate a first combined signal based on a combination of the left channel signal L and the right channel signal R and output the first combined signal at a first output 310 connected to the left channel amplifier 32. The right channel amplifier section 33 may be connected to the left channel input 300 and the right channel input 301.

The right channel amplifier section 33 may generate a second combined signal based on a combination of the left channel signal L and the right channel signal R and output the second combined signal at a second output 311 connected to the right channel amplifier 33.

The common mode section 34 may be connected to the left channel input and the right channel input. The common mode section 34 may generate a common mode signal based on a combination of the first signal and the second signal and output the common mode signal at a common output 312 connected to the common mode amplifier 34.

The first combined signal and the common mode signal may satisfy the condition that combining the first combined signal and the common mode signal results in an amplified left channel signal with an amplitude proportional to the amplitude of the left channel input signal. The second combined signal and the common mode signal may satisfy the condition that combining the second combined signal and the common mode signal results in an amplified right channel signal with an amplitude proportional to the amplitude of the right channel input signal.

Thus, the (amplified) left and right channel signals may be obtained from the outputs 310-312 of the amplifier circuit 10. Thereby, the need to provide a virtual ground and to provide an operational amplifier connected to the common mode output is obviated. Accordingly, the power consumption and size of the amplifier circuit 10 may be reduced. Furthermore, a good isolation between the right channel and left channel can be obtained. Also, as shown in FIG. 3, the amplifier circuit 30 may be used with existing audio systems, e.g. headphones, for example those in which the loudspeakers are connected with a three wire cable and a three pole plug.

The first combined signal $s_1$ and the common mode signal $s_{common}$ may for example satisfy the mathematical relationship:

$$f_1(s_1(t), s_{common}(t)) = f(s_1(L(t),R(t)), s_{common}(L(t),R(t))) = a \cdot L(t), \quad (1)$$

in which equation $f_1(s_1, s_{common})$ represents the combining function, L(t) the left channel signal, R(t) the right channel signal, a represents an amplification factor in the range of 0 to ∞ and t represents time.

The second combined signal $s_2$ and the common mode signal $s_{common}$ may for example satisfy the mathematical relationship:

$$f_2(s_2(t), s_{common}(t)) = f_2(s_2(L(t),R(t)), s_{common}(L(t),R(t))) = a \cdot R(t), \quad (2)$$

in which equation $f_2(s_2, s_{common})$ represents the combining function and R(t) the right channel signal. In equations (1) and (2), the amplification factor a may be constant or vary in time or as a function of another parameter, such as the amplitude of the respective channel signal. The amplification factor or gain a may for example be constant for channel signals with an amplitude in a certain range in which case the amplifier circuit operates as a linear amplifier for channel signals with an amplitude in that range.

The first combined signal $s_1$ and the common mode signal $s_{common}$ may for example satisfy the condition that superimposing the first combined signal $s_1$ on the common mode signal $s_{common}$ or vice versa results in an amplified left channel signal with an amplitude proportional to the amplitude of the left channel signal L. The second combined signal $s_2$ and the common mode signal $s_{common}$ may for example satisfy the condition that superimposing the second combined signal $s_2$ on the common mode signal $s_{common}$ or vice versa results in an amplified right channel signal with an amplitude proportional to the amplitude of the right channel signal R.

For example, the first combined signal $s_1$ and the common mode signal $s_{common}$ may for example satisfy the mathematical relationship:

$$s_1(L(t),R(t)) - s_{common}(L(t),R(t)) = a \cdot L(t), \quad (3)$$

The second combined signal $s_2$ and the common mode signal $s_{common}$ may for example satisfy the mathematical relationship:

$$s_2(L(t),R(t)) - s_{common}(L(t),R(t)) = a \cdot R(t), \quad (4)$$

For instance, the first combined signal $s_1$ may be obtained by a superposition of the left channel input signal and the right channel input signal to obtain a combined signal. As shown in FIG. 3, for instance, one or more of the sections 32-34 may include a combining unit 35 connected to the left channel input 300 and to the right channel input 301. The combining unit may perform a superposition of the left channel input signal L and the right channel input signal R to obtain a combined signal.

The superposition in the left channel amplifier section 32 may for example be an operation as may be described by the mathematical relationship:

$$S_1(t) = L(t) - R(t), \quad (5)$$

As shown in FIG. 3, for instance the combining unit 35 may subtract the right channel signal R from the left channel signal L and be connected with a positive input to the left channel input 300 with a negative input to the right channel input 301.

In the second amplifier section 33 the second combined signal $s_2$ may for example be obtained by a superposition of the left channel input signal and the right channel input signal to obtain a combined signal, for example as may be described by the mathematical relationship:

$$s_2(t) = -L(t) + R(t), \quad (6)$$

As shown in FIG. 3, for instance the combining unit 35 in the right channel amplifier section 33 may subtract the left channel signal L from the right channel signal R and be connected with a negative input to the left channel input 300 and with a positive input to the right channel input 301.

For instance, in the common mode section 34 the common mode signal $s_{common}$ may be obtained by a superposition of the left channel input signal and the right channel input signal to obtain a combined signal, for example as may be described by the mathematical relationship:

$$s_{common}(t) = -L(t) - R(t), \quad (7)$$

As shown in FIG. 3, for instance the combining unit 35 in the common mode section 34 may subtract the left channel signal L from an inverted right channel signal R and be connected with a negative input to the left channel input 300 and with a negative input to the right channel input 301.

Figure 1:
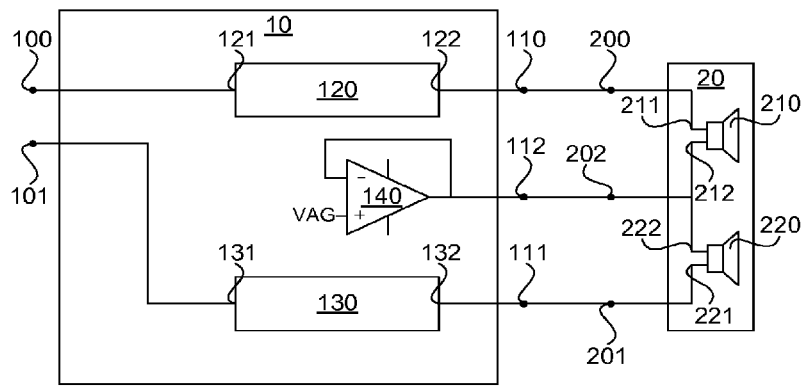
FIG. 1 shows a block diagram of a configuration of an amplifier circuit and a headset as known from the prior art.
Figure 2:
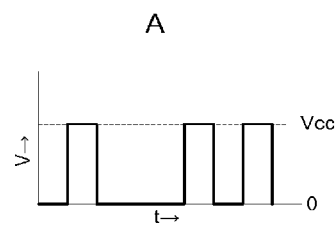
FIGS. 2A-2C schematically show graphs of the voltage as a function of time at the channel contacts of the amplifier circuit shown in FIG. 1.
Figure 4:
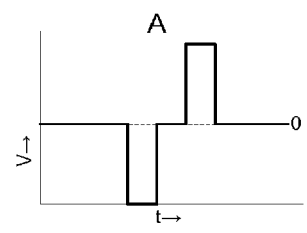
FIGS. 4A-4C schematically show examples of graphs of the voltage as a function of time at the contacts of the example of an embodiment of an amplifier circuit shown in FIG. 3.
Figure 5:
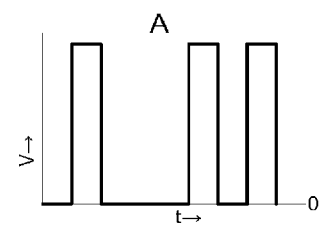
FIGS. 5A and 5B schematically show examples of graphs of the difference voltage as a function of time between the channel contacts and the common ground contact of the example of an embodiment of an amplifier circuit shown in FIG. 3.
Figure 5:
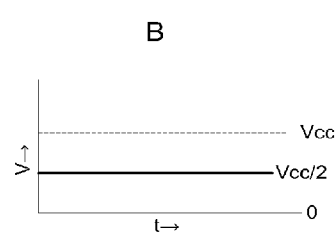
Figure 5:
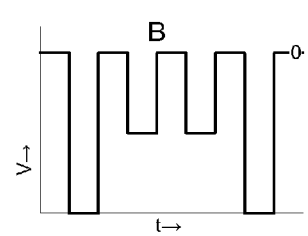
Figure 5:
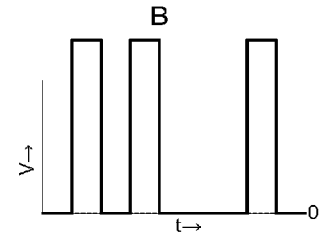
Figure 5:
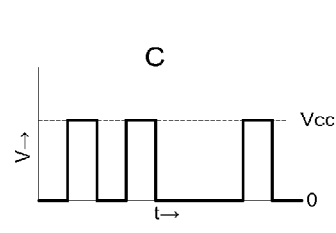
Figure 5:
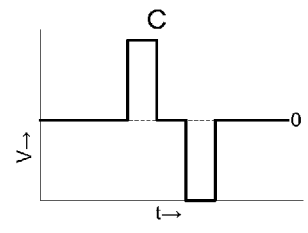

Referring to FIGS. 4 and 5, in FIG. 4A the output of the left channel amplifier section is shown, supposing that the left channel input signal L and the right channel input signal R correspond to those shown in FIGS. 2A and 2C. In FIG. 4B, the output of the common mode section is shown. In FIG. 4C the output of the right channel amplifier section is shown.

As shown in FIG. 5A and B, an amplified left or right channel signal can be obtained by combining the output of the left channel amplifier 32 (or the right channel amplifier 33) and the output of the common mode section 34, for example by superimposing the first or second combined signal $s_1, s_2$ and the common mode signal $s_{common}$. As shown in FIG. 3, for example, the first output 310 and the common mode output 312, as well as the second output 311 and the common mode output 312, may be connected to opposite, e.g. positive and negative contacts 411,412 of a load to be driven. The load driven by the amplifier circuit may be any suitable type of load and for example be one or more transducers which can convert the first and second amplified channel signals into respective acoustic signals, e.g. loudspeakers 410,420 of e.g. a headset 40. Thus, the load is driven by the difference between the first combined signal $s_1$ and the common mode signal e.g. by $s_1 - S_{common} = L - R - (-L - R) = 2L$ (that is by the amplified left channel signal, which in this example is obtained by a linear superposition of the first combined signal $s_1$ on the common mode signal).

The sections 32-34 may be implemented in any manner suitable for the specific implementation. As shown in FIG. 3, two or more of the left channel amplifier section 32, the right channel amplifier section 33 and the common mode section 34 may be similar. In the example of FIG. 3 all sections have the same design. Thereby design time may be reduced and matching of the outputs 310-312 may be relatively simple.

Figure 6:
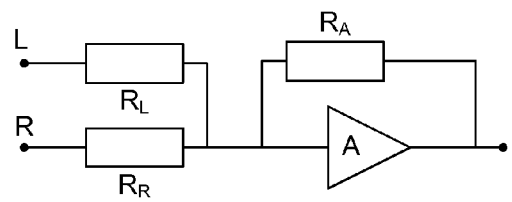
FIG. 6 shows a block diagram of an example of a configuration of a second example of an embodiment of an amplifier circuit and a headset.

The combining unit 35 may for instance be implemented as separate unit connected to an amplifier 34, e.g. an adder which is connected with the suitable inputs to an inverter, and thus receives an inverted signal, e.g. an inverted left channel signal −L and/or an inverted right channel signal −R. However, as illustrated in FIG. 6, the combining unit 35 may be integrated in the amplifier 34, and for example be implemented in a summing amplifier. In the example of FIG. 6, resistors $R_L$, $R_R$ are connected to the left and right channel input respectively, and may for example receive the left or right channel signal or an inverted left or right channel signal. An amplifier resistor $R_A$ connects the output of the amplifier A to the input of the amplifier. The output $V_A$ of the amplifier A is thus equal to $V_A = -R_A(V_L \cdot R_L + V_R \cdot R_R)$ with $V_L$ and $V_R$ representing the voltage of the left channel signal and the right channel signal respectively.

As illustrated in FIG. 3, each of the sections 32-34 may include a respective amplifier 36 which is positioned, in a signal processing direction, downstream of the combining unit 35. The amplifier 36 may be any type of amplifier suitable for the specific implementation, such as a Class A or Class A/B amplifier or be a switched amplifier, such as a class D amplifier.

In the example of FIG. 3, in each section 32-34 the combining unit 35 is connected with a first input 350 to the left channel input 300 and connected with a second input 351 to the right channel input 301. The output 352 of the combiner unit 35 is connected to an amplifier input 360 of the amplifier 36. The amplifier output 361 of the amplifier 36 is connected to a respective one of the outputs 310-312 of the amplifier circuit 30.

Figure 7:
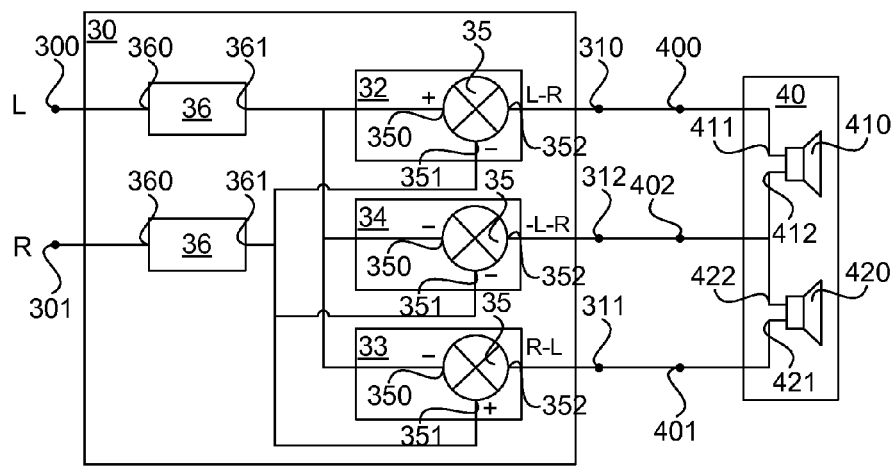
FIG. 7 shows a block diagram of an example of an embodiment of an amplifier section.

However, the amplifier 36 may be positioned, in the signal processing direction, upstream of the combining unit 35. As illustrated in FIG. 7, for example, a left channel amplifier 36 may be present between the left channel input 300 and the amplifier sections 32-34 and a right channel amplifier 36 may be present between the right channel input 301 and the amplifier sections 32-34. In this example, each amplifier 36 is connected with the amplifier input 360 to a respective channel input 300,301. The amplifier output 361 is connected to a respective input 350,351 of the combining unit of the sections 32-34. The output 352 of the combining unit 35 is connected to a respective output 310-312 of the amplifier circuit 30.

The amplifier circuit 30 may be implemented as an audio amplifier, that is an amplifier which amplifies signals composed primarily of frequencies between 20 hertz to 20,000 Hertz, such as low-power audio signals to a level suitable for driving loudspeakers and is suitable as the final stage in a typical audio playback chain connected to the loudspeakers. Although other values may be used, it is found that suitable values for an amplifier used for driving loudspeakers may for example be a gain of between 0 and 40 dB, such as 39 dB or less. It is found that suitable values for an amplifier used for driving headphones are, for example, at least 6 dB and/or not more than 12 dB.

Figure 8:
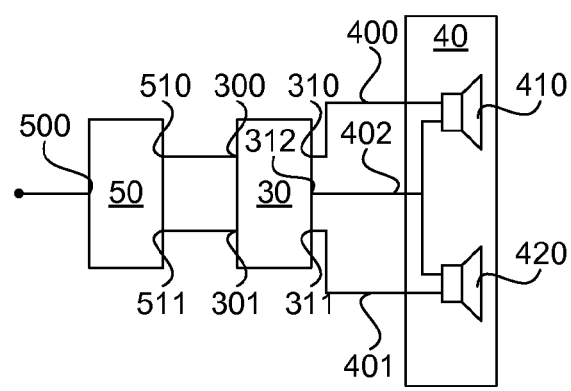
FIG. 8 shows a block diagram of an example of an example of an embodiment of an audio circuit.

Referring to FIG. 8, the amplifier circuit 30 may for example form part of an audio circuit for a set 40 of two or more loudspeakers 410,420. The audio circuit may include a signal processing unit 50 having a first signal output 510 for outputting a first processed audio signal and a second signal output 511 for outputting a second process audio signal and the amplifier circuit 30. The amplifier circuit 30 may be connected with the left channel input 300 to the first signal output 510 of the signal processing unit 50 and with the right channel input 301 to the second signal output 511. The signal processing unit 50 may for example perform, in operation, functions like pre-amplification, equalization, tone control, mixing/effects and may be connected with a signal processing input 500 to sources of audio signals such as one or more of: radio receiver, optical disk players, non-volatile memory with audio data stored thereon or other suitable source of audio signals.

Figure 9:
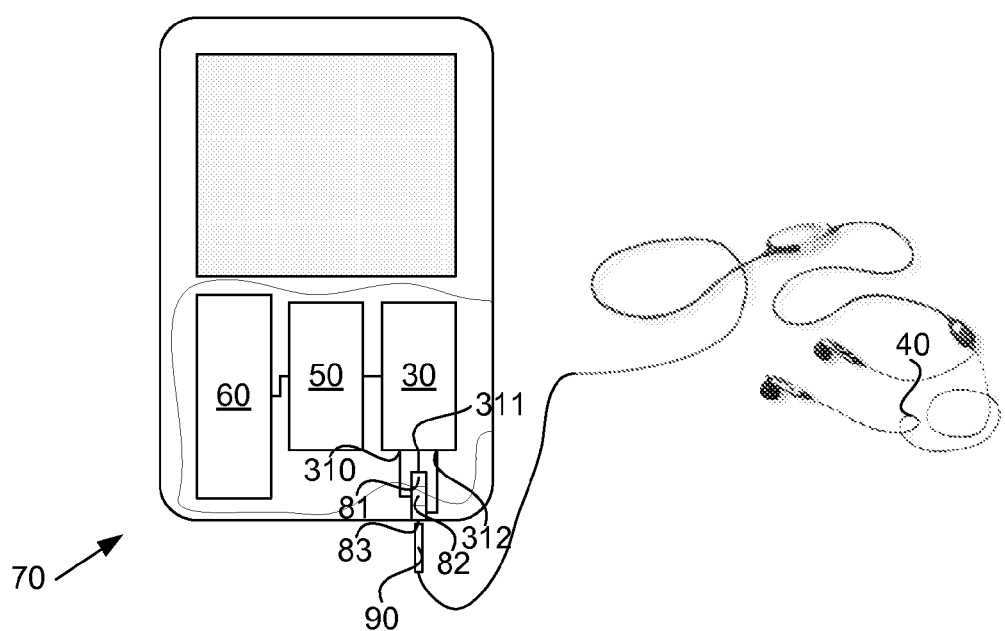
FIG. 9 shows a block diagram of an example of an embodiment of an electronic device.

As illustrated in FIG. 9, the amplifier circuit may include a first connector for connecting the first output and the common mode output of the amplifier circuit to a first load and a second connector for connecting the second output and the common mode output to a second load. The amplifier circuit may for example include a multi-pole jack connector having at least three poles of which a first pair of poles forms the first connector and a second pair of poles forms the second connector. In the example of FIG. 9, for instance, the outputs 310-312 are connected to respective poles 81-83 of a three pole socket 80. As shown, the loudspeakers of the headset may be connectable to the audio circuit with a plug 90 which is compatible with the socket 80.

As shown in FIG. 9, the input of the signal processor 50 may be connected to a source of audio signals, in this example to a non-volatile memory 60 on which data representing audio signals can be stored, for example in a compressed form.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be an type of connection suitable to transfer signals from or to the respective nodes, units or devices, for example via intermediate devices. Accordingly, unless implied or stated otherwise the connections may for example be direct connections or indirect connections.

Also, for example, although in the present document reference has been made to headsets and headset interface circuits being interconnected using two or more wires, these wires will generally be bundled in a single cable.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. For example, the amplifier circuit 30 may be implemented as a number of separate integrated circuits (e.g. which each include one of the sections 32-34) connected to form the amplifier circuit Also, devices functionally forming separate devices may be integrated in a single physical device. For example, the amplified circuit 30 and the signal processor 50 may be implemented as a single integrated circuit, for example as a single die or as two or more dies packaged in a single integrated circuit package.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to advantage.

The invention claimed is:

1. An amplifier circuit, comprising:
    a first input for receiving a first input signal;
    a first amplifier connected to said first input for outputting a first amplified signal based upon the first input signal;
    a second input for receiving a second input signal;
    a second amplifier connected to said second input for outputting a second amplified signal based upon the second input signal;
    a first combiner section connected to said first amplifier and said second amplifier, for combining said first amplified signal and said second amplified signal into a first combined signal, said first combiner section being connected to a first output, for outputting said first combined signal;
    a second combiner section connected to said first amplifier and said second amplifier, for combining said first amplified signal and said second amplified signal into a second combined signal, said second combiner section being connected to a second output, for outputting said second combined signal; and
    a common mode section connected to said first amplifier and said second amplifier, for generating a common mode signal based on a combination of said first amplified signal and said second amplified signal and outputting said common mode signal at a common output connected to said common mode section,
    wherein the first combined signal, the second combined signal and the common mode signal satisfy the condition that combining the first combined signal and the common mode signal results in a third amplified signal with an amplitude proportional to the amplitude of the first input signal and combining the second combined signal and the common mode signal results in a fourth amplified signal with an amplitude proportional to the amplitude of the second input signal.

2. An amplifier circuit as claimed in claim 1, wherein the first combined signal, the second combined signal and the common mode signal satisfy the condition that superimposing the first combined signal on the common mode signal or vice versa results in a signal with an amplitude proportional to the amplitude of the first input signal and superimposing the second combined signal on the common mode signal or vice versa results in a signal with an amplitude proportional to the amplitude of the second input signal.

3. An amplifier circuit as claimed in claim 1, wherein at least one of said sections comprises:
    a combining section connected to said first amplifier and to said second amplifier, for performing a superposition of said first input signal and said second input signal to obtain a combined signal.

4. An amplifier circuit as claimed in claim 1, wherein:
    said first output and said common output are connectable to a first transducer for converting said third amplified signal into a first acoustic signal and said second output and said common output are connectable to a second transducer for converting said fourth amplified signal into a second acoustic signal.

5. An amplifier circuit as claimed in claim 1, wherein said first input signal and said second input signal are stereo audio signals.

6. An amplifier circuit as claimed in claim 1, wherein at least one of said amplifiers includes a switched amplifier, wherein a switched amplifier includes a class D amplifier.

7. An amplifier circuit as claimed in claim 1, wherein at least two of said first combiner section, said second combiner section and said common mode section are similar.

8. An amplifier circuit as claimed in claim 1, including a first connector for connecting said first output and said common mode output of said amplifier circuit to a first load and a second connector for connecting said second output and said common mode output to a second load.

9. An amplifier circuit as claimed in claim 8, wherein said first load and said second load are loudspeakers.

10. An amplifier circuit as claimed in claim 8, including a multi-pole jack connector having at least three poles of which a first pair of poles forms said first connector and a second pair of poles forms said second connector.

11. An audio circuit for a set of at least two loudspeakers, comprising:
    a signal processing unit having an input for receiving at least one audio signal, a first signal output for outputting a first processed audio signal and a second signal output for outputting a second processed audio signal; and
    an amplifier circuit as claimed in claim 1, with said first input of said amplifier circuit connected to said first signal output of said signal processing unit and with said second input of said amplifier circuit connected to said second signal output of said signal processing unit.

12. An electronic device including: a source of audio signals and an audio circuit as claimed in claim 11.

13. An amplifier circuit as claimed in claim 2, wherein at least one of said sections comprises:
    a combining section connected to said first amplifier and to said second amplifier, for performing a superposition of said first input signal and said second input signal to obtain a combined signal.

14. An amplifier circuit as claimed in claim 2, wherein:
    said first output and said common output are connectable to a first transducer for converting said third amplified signal into a first acoustic signal and said second output and said common output are connectable to a second transducer for converting said fourth amplified signal into a second acoustic signal.

15. An amplifier circuit as claimed in claim 3, wherein:
    said first output and said common output are connectable to a first transducer for converting said third amplified signal into a first acoustic signal and said second output and said common output are connectable to a second transducer for converting said fourth amplified signal into a second acoustic signal.

16. An amplifier circuit as claimed in claim 2, wherein said first input signal and said second input signal are stereo audio signals.

17. An amplifier circuit as claimed in claim 3, wherein said first input signal and said second input signal are stereo audio signals.

18. An amplifier circuit as claimed in claim 4, wherein said first input signal and said second input signal are stereo audio signals.

19. An amplifier circuit as claimed in claim 2, wherein at least one of said amplifiers includes a switched amplifier.

20. An amplifier circuit as claimed in claim 3, wherein at least one of said amplifiers includes a switched amplifier, wherein a switched a includes a class D amplifier.

\* \* \* \* \*